United States Patent [19]

Dunlavy

[11] 4,167,985

[45] Sep. 18, 1979

[54] SPEAKER SYSTEM

[76] Inventor: John H. Dunlavy, 4225 Senna Dr., Las Cruces, N. Mex. 88001

[21] Appl. No.: 724,582

[22] Filed: Sep. 20, 1976

Related U.S. Application Data

[63] Continuation-in-part of Ser. No. 686,115, May 13, 1976, abandoned.

[51] Int. Cl.[2] .......................... H05K 5/00; A47B 81/06

[52] U.S. Cl. .......................... 181/148; 181/146; 181/151; 181/199

[58] Field of Search .............. 181/151, 199, 148, 153, 181/145, 159, 167, 144, DIG. 1, 146; 179/1 E, 146 H

[56] References Cited

U.S. PATENT DOCUMENTS

| | | | |
|---|---|---|---|
| 2,315,896 | 4/1943 | Dumas | 181/151 |
| 2,881,850 | 4/1959 | Bonn | 181/153 |
| 2,904,123 | 9/1959 | Nigro | 181/145 |
| 3,192,322 | 6/1965 | Leslie | 181/151 |
| 3,520,559 | 7/1970 | Ross | 181/143 |
| 3,826,333 | 7/1974 | Buckwalter | 181/153 |
| 3,909,531 | 9/1975 | Plummer | 181/145 |
| 3,944,020 | 3/1976 | Brown | 181/153 |
| 3,964,571 | 6/1976 | Snell | 181/199 |
| 3,982,607 | 9/1976 | Evans | 181/152 |
| 3,993,345 | 11/1976 | Croup | 181/199 |
| 4,057,689 | 11/1977 | Stallings, Jr. | 181/153 |

FOREIGN PATENT DOCUMENTS

| | | | |
|---|---|---|---|
| 697869 | 11/1964 | Canada | 181/167 |
| 548292 | 4/1932 | Fed. Rep. of Germany | 181/199 |
| 810661 | 10/1951 | Fed. Rep. of Germany | 181/199 |
| 1326414 | 4/1963 | France | 181/167 |
| 827306 | 2/1960 | United Kingdom | 181/DIG. 1 |

*Primary Examiner*—Stephen J. Tomsky
*Attorney, Agent, or Firm*—Lane, Aitken & Ziems

[57] ABSTRACT

A speaker system in which at least one driver is mounted on an enclosure and is adapted to radiate sound waves outwardly from said enclosure in response to an input signal. A sound absorbing material is disposed on at least a portion of the outer surface area of said enclosure to reduce the effect of diffractions and reflections of said sound waves relative to said enclosure.

12 Claims, 14 Drawing Figures

SPEAKER SYSTEM

CROSS-REFERENCE TO RELATED APPLICATION

This application is a continuation-in-part application of copending U.S. Pat. application Ser. No. 686,115, filed May 13, 1976, now abandoned.

BACKGROUND OF THE INVENTION

This invention relates to a high fidelity speaker system and more particularly to a speaker system of the highest quality, suitable for stereo applications, wherein the undesirable effects produced by sound wave diffraction at the edges of the speaker enclosure are reduced.

Recent improvements in the recording and reproduction of music by electronic means have advanced the art to the point where the speaker system has become the weakest link in the reproduction chain. One of the principal problems encountered by audio engineers tasked with the design of "hi-fi" speakers is that associated with or arising from the diffraction of sound waves at the edges of most speaker enclosures.

A speaker driver element having a diaphragm or cone with a diameter that is small with respect to the smallest wavelength, will radiate a sound wave into space that is essentially bipolar in nature. If this same driver element is placed symmetrically in the center of one face of a closed cubical enclosure, the radiation will be spherically divergent and the polar response pattern will be approximately spherical, i.e., omni-directional in all planes, so long as the perimeter of the box remains small with respect to a wavelength at the frequency being radiated. However, a portion of the wave radiated by the driver propagates along the outside surface of the enclosure until it reaches the side edges. Here, the wave encounters a sudden discontinuity and, because of the lack of any further supporting surface, its amplitude must go to zero. This results in the production of a wave phenomena known as diffraction. In the process of being diffracted from the side edges of the enclosure, some fraction of this wave is reflected back toward the driver element, another fraction is reradiated into the surrounding space as a new, omni-directional sound source, while the remaining fraction continues propagating around the corner headed for the near edges of the enclosure where the diffraction process is repeated.

Thus, along the front and side faces of the enclosure, the reflected waves interact with the direct wave to form an interference pattern, commonly referred to as a standing wave pattern. So long as the time delay between the original, direct wave, sound and the diffracted sound sources is small in terms of the fraction of a cycle at the frequency being radiated, little destructive interference occurs and the shape of the radiation pattern remains essentially omni-directional. However, as the width of a face of the enclosure approaches a full wavelength, the reflected portion of the diffracted wave generates a standing wave pattern in the form of two juxtapositioned semicircular lobes, together extending for the width of the enclosure face. This results in a relative gain of two since both standing wave maximums are in phase. When the width of the front face of the enclosure is substantially equal to two full wavelengths, the standing wave pattern takes the form of four juxtapositioned semicircular lobes together extending for the width of the enclosure face, with the two inner lobes having a positive polarity and the two outer lobes having a negative polarity. Since each maximum represents an apparent source of sound radiation, cancellation occurs in front of the speaker, which results in a forward null in the polar pattern response of the speaker system, i.e., a null on axis or at zero degrees using conventional geometrical coordinates. As the size of the enclosure increases until a side is wider than several wavelengths, multiple lobes of the above type will appear in the polar pattern.

In addition to the destructive effect on the polar response pattern which diffraction causes, another serious degradation in quality of reproduction will occur. This pertains to the pulse response of the system. For example, suppose that at a given frequency, the width of the aforementioned speaker enclosure is equal to two wavelengths. At this frequency, "ringing" due to the diffracted wave will reach a distant, on-axis listener at least a full wavelength (one cycle) later than the direct wave. If the signal fed to the driver were a "tone-burst" consisting of perhaps three cycles of the subject frequency, the listener would actually hear four or more full cycles instead of three. More complex wave forms such as those experienced in music would appear to be equally distorted because of ringing due to the late arrival of the diffracted wave. The ear would perceive this form of distortion as a tonal change or imbalance rather than a reflected sound such as that normally occurring from the walls of a room because of the much shorter delay time involved.

Further, the amplitude vs. frequency response of such a speaker, measured on axis, will show "drop-outs" at those frequencies corresponding to the geometrical on-axis nulls in the polar pattern response. The off-axis frequency response will likewise not be smooth, and will show a series of "drop-outs." Depending upon the relative strength between the direct and diffracted waves, these amplitude minimums in frequency response may vary from a few decibels (dB) to as much as 30 dB, or more. In addition to the nulls, amplitude maximums of 3 dB or more also occur periodically with rising frequency.

As speaker technology slowly developed from its beginning over 50 years ago, numerous attempts have been made to arrive at a design which minimized the undesirable effects of diffraction. Indeed, during the late 1930's and early 1940's, several attempts were made to "round" the edges of the enclosure as a means of eliminating the sudden discontinuity represented by the sharp, square edge. This provided a partial solution so long as the radius of curvature at the edges was sufficient to reduce diffraction to a minimum. Unfortunately, the required curvature results in an enclosure which is not fully acceptable to the general public at the present time in terms of cosmetic or aesthetic appeal.

In the 1950's, it was found that some of the effects of diffraction could be minimized by mounting the midrange driver and/or tweeter at an asymmetrical location along the front face of a rectangular enclosure. While a proper choice of driver location will result in a general smoothing of a frequency response curve taken "on-axis", i.e., at a large distance in front of the speaker, the "off-axis" frequency response curve will show the usual undulations of amplitude vs. frequency typical of diffraction and standing-wave problems. Such asymmetrical placement of drivers also results in what is called a skewed lobe, i.e., the polar response pattern radiated by the speaker is not centered on the forward, zero degree, axis. This effect may take several different forms: the lobe may be tilted up or down in the vertical plane, it may be "skewed" to the right or left of center, or the maximum of the lobe may be centered while the shape of the lobe is asymmetrical about the zero degree axis. Advantage has been taken of this characteristic by certain designs which utilize a matched pair, i.e., a "right" position speaker and a "left" position speaker. However, such designs suffer from the fact that the degree of lobe "skew" or "tilt" changes with frequency.

Yet another recent claim for a solution to the diffraction problem is that provided by systems utilizing an "acoustical suspension" type woofer mounted in a closed rectangular box. Four separate midrange and tweeter drivers are mounted in an array above the woofer enclosure, without any enclosures of their own, using small plates and mounting brackets. The polar pattern radiated by some of these drivers is typically that from a dipole (bi-directional), while that radiated by others varies from omni-directional (spherical) to uni-directional. (The highest frequency tweeter, a piezoelectric horn, has a uni-directional lobe about 40° wide between half-power points.) While this technique might initially appear to eliminate diffraction problems, a closer examination will reveal the fact that the wide-angle radiation from the "unbaffled" midrange units results in the generation of reflections between adjacent driver surfaces, between some of the drivers and the top of woofer enclosure, and between some of the drivers and the side panels of the enclosure. The effect of these reflections is the generation of a complex standing-wave pattern that is perhaps at least equal in severity to that experienced with ordinary speaker designs.

Still another solution to the diffraction problem is that afforded by the mounting of speaker drivers along the curved surface of a vertical cylinder. While this works well with smaller drivers such as midrange unit or tweeter, it creates the problem of how to mount the larger woofer. In the most popular version of this type design, the woofer is mounted on the flat bottom side of the cylinder with an annular slot opening between the woofer and the floor. However, this configuration results in a phasing problem between the woofer and the midrange drivers due to the time-lag difference encountered. The use of a very low crossover frequency tends to minimize the fluctuations in frequency response due to the actual time delay between the two drivers, but does not fully solve the resulting degradation in transient response. Also, when relatively wide spacing is utilized between adjacent drivers of a speaker system, undesirable lobing of a type similar to that discussed above will occur.

As a result of the foregoing, it should be apparent that the formation of acoustical standing-waves on the front face and on the sides of a speaker enclosure represent a serious problem confronting the design engineer attempting to formulate the specifications for a hi-fi speaker system. Any design for a speaker enclosure which permits such standing-waves will prove, if accurately measured, to yield relatively poor performance with respect to pulse response and time delay distortion. Also, the standing waves will cause large excursions in amplitude vs. frequency response, as well as the formation of undesirable nulls and lobing in the polar response pattern.

SUMMARY OF THE INVENTION

It is, therefore, an object of the present invention to provide a speaker system that prevents the occurrence of wave diffractions along the frontal edges of the enclosure and the resultant formation of standing waves.

It is a further object of the present invention to provide a speaker system of the above type in which the front edges of the speaker enclosure are surrounded with a material which efficiently absorbs the sound waves at the appropriate wavelengths and permits little, if any, reflections of such sound waves that appear incident upon their surface.

It is a still further object of the speaker system of the present invention to provide a speaker system of the above type which exhibits a markedly flatter curve of amplitude response vs. frequency response than is normally obtainable, a radiation pattern which is symmetrical about the forward geometrical axis of the enclosure, and a pulse response which is essentially free of ringing due to the delayed reradiation from different images.

It is a still further object of the present invention to provide a speaker system of the above type in which the various drivers of the system, i.e., the woofer, midrange and tweeter, are located in a theoretically ideal relationship along a common vertical line bisecting the front panel or face of the enclosure.

It is a still further object of the present invention to provide a speaker system of the above type in which the woofer is mounted at the lowest level as close to the surface of the floor as possible, the midrange next to the woofer, and the tweeter at the upper level with all three drivers located relatively close together in order to keep the angular dispersion in the vertical plane as great as possible and to reduce undesirable lobing of the polar response pattern.

Toward the fulfillment of these and other objects, the speaker system of the present invention comprises an enclosure, at least one driver mounted on the enclosure and adapted to radiate soundwaves outwardly from the enclosure in response to an input signal, and a sound absorbing material disposed on at least a portion of the total outer surface area of the enclosure to reduce the effect of diffractions and reflections of the sound waves relative to the enclosure.

DESCRIPTION OF THE PREFERRED EMBODIMENT

Figure 1:
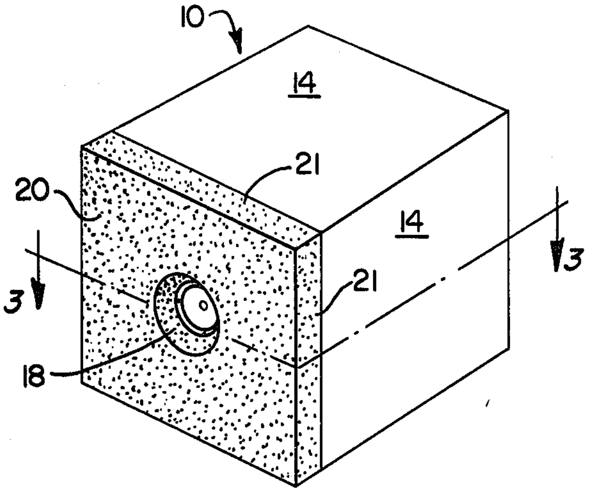
FIG. 1 is a perspective view depicting one embodiment of the speaker system according to the present invention.
Figure 2:
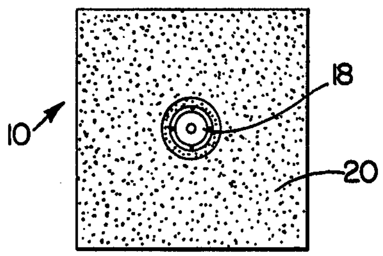
FIG. 2 is a front elevational view of the speaker system of FIG. 1.
Figure 3:
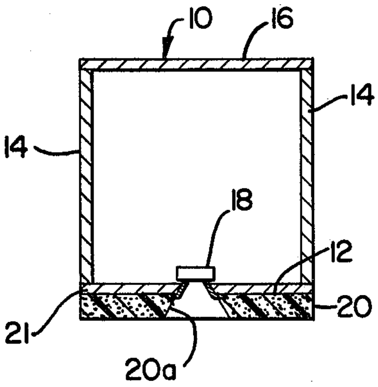
FIG. 3 is a cross-sectional view taken along the line 3—3 of FIG. 1.

Referring specifically to the embodiment depicted in FIGS. 1-3 of the drawings, the reference numeral 10 refers in general to a cubical enclosure formed of wood, particle board, or any conventional type of enclosure material and having a front panel 12, four sides 14, and a rear panel 16. A driver, or individual speaker, 18 extends through an opening in, and is mounted relative to, the front panel 12 in a conventional manner i.e., so that the frontal portion of the driver extends flush with the outer face of the front panel 12 as shown in FIGS. 1-3.

A sheet 20 of sound absorbing material extends over the outer surface of the front panel 12 and has an opening 20*a* extending therethrough which surrounds the driver 18. The thickness of the sheet 20 is selected to insure adequate absorption of sound energy propagating between the driver 18 and the front edges 21 of the enclosure 10. This absorption of the sound energy greatly reduces the amplitude of the reflected waves from the edges 21 so that standing waves either do not form or, if formed, are too low in amplitude to be of practical concern.

The sound absorbing material must exhibit a high absorption efficiency within the range of frequencies being radiated by the driver 18 in order to keep the required thickness of the material at a minimum. The specific type of material that is preferred will be discussed in detail later.

Figure 4:
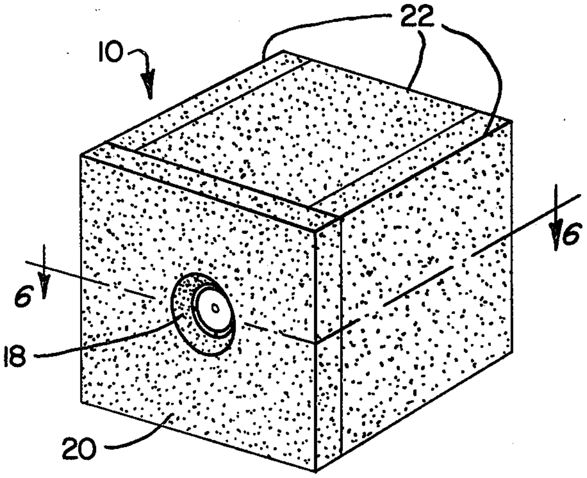
FIG. 4 is a perspective view similar to FIG. 1 but depicting an alternate embodiment of the speaker system of the present invention.
Figure 5:
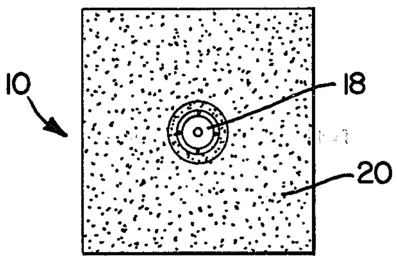
FIG. 5 is a front view of the speaker system of FIG. 4.
Figure 6:
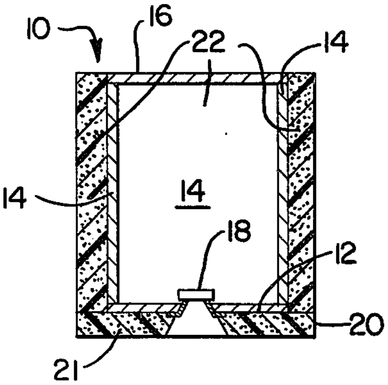
FIG. 6 is a cross-sectional view taken along the line 6—6 of FIG. 4.

Since the embodiment of FIGS. 4-6 is substantially similar to that of the embodiment of FIGS. 1-3, the same reference numerals will be utilized to denote identical structure. According to the embodiment of FIGS. 4-6, the sides 14 of the enclosure are all covered with additional sheets 22 of the sound absorbing material which are overlapped by the sheet 20 at the corners of the enclosure defined by the front panel 12 and the sides 14. The use of the sheets 22 of sound absorbing material even further minimizes the effects of edge reflection and diffraction. Otherwise, the embodiment of FIGS. 4-6 is identical to that of FIGS. 1-3.

Figure 7:
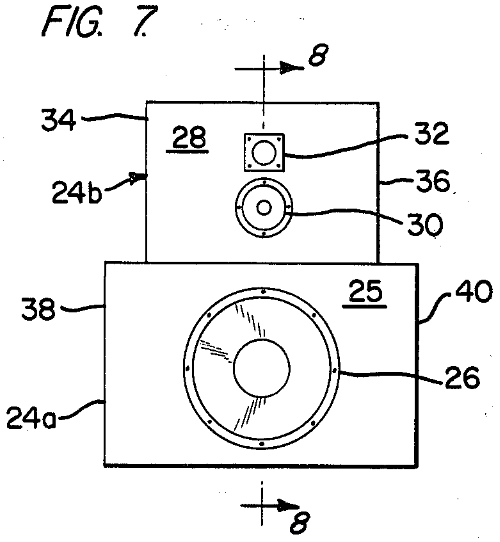
FIG. 7 is a front elevational view of another embodiment of the speaker system of the present invention, depicting the basic speaker system without the sound absorbing material.
Figure 8:
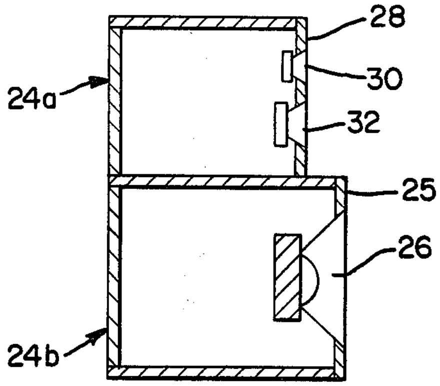
FIG. 8 is a cross-sectional view taken along the line 8—8 of FIG. 7.
Figure 10:
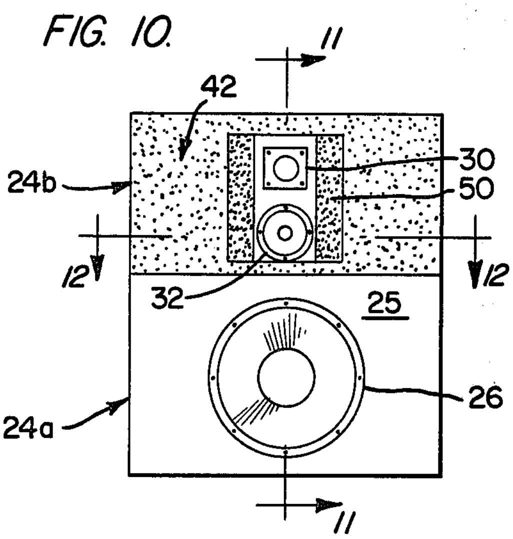
FIG. 10 is a front elevational view of the speaker system of FIG. 9.
Figure 11:
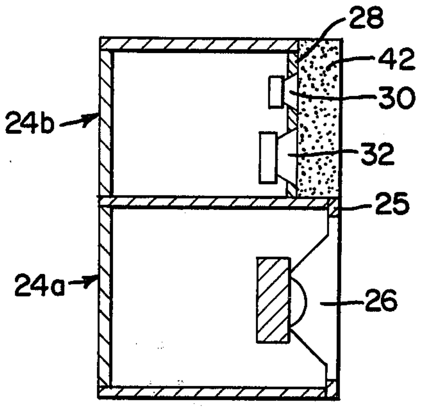
FIG. 11 is a cross-sectional view taken along the line 11—11 of FIG. 10.

Referring specifically to the embodiment of FIGS. 7-12, for clarity of presentation FIGS. 7 and 8 depict a basic enclosure including the drivers, but without the sound absorbing material applied thereto. In particular, the basic enclosure consists of two subenclosures 24*a* and 24*b* which can be constructed separately or can be formed integrally with the use of a common rear panel and a common partition forming the bottom of the subenclosure 24*b* and the top of the subenclosure 24*a*. The subenclosure 24*a* includes a front panel 25 in which a woofer 26 is mounted, and the subenclosure 24*b* includes a front panel 28 in which a midrange unit 30 and a tweeter 32 are mounted in a vertically aligned relationship. As noted from FIG. 7, the woofer driver 26, the midrange driver 30 and the tweeter driver 32 are located along a common vertical line bisecting the front panels 25 and 28 of the subenclosures 24*a* and 24*b*, respectively, and the midrange driver 30 and the tweeter driver 32 are mounted relatively close together.

It is noted from FIG. 8 that the front panel 28 of the subenclosure 24*b* is spaced inwardly from the front panel 25 of the subenclosure 24*a*. In a similar manner the subenclosure 24*b* has two sides 34 and 36 which are spaced inwardly from the corresponding sides 38 and 40 of the subenclosure 24*a*.

Referring specifically to FIGS. 9-12, a sheet 42 of sound absorbing material is disposed on the outer surface of the front panel 28 of the subenclosure 24*b*, and sheets 44 and 46 of the sound absorbing material are disposed along the sides 34 and 36 of the latter subenclosure. The sheet 42 overlaps the sheets 44 and 46 at the corners of the subenclosure 24*b* defined by the front panel 28 and the sides 34 and 36.

Figure 12:
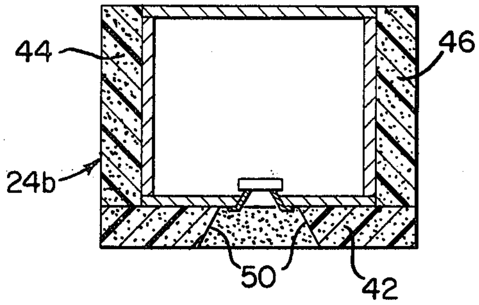
FIG. 12 is a cross-sectional view taken along the line 12—12 of FIG. 9.
Figure 9:
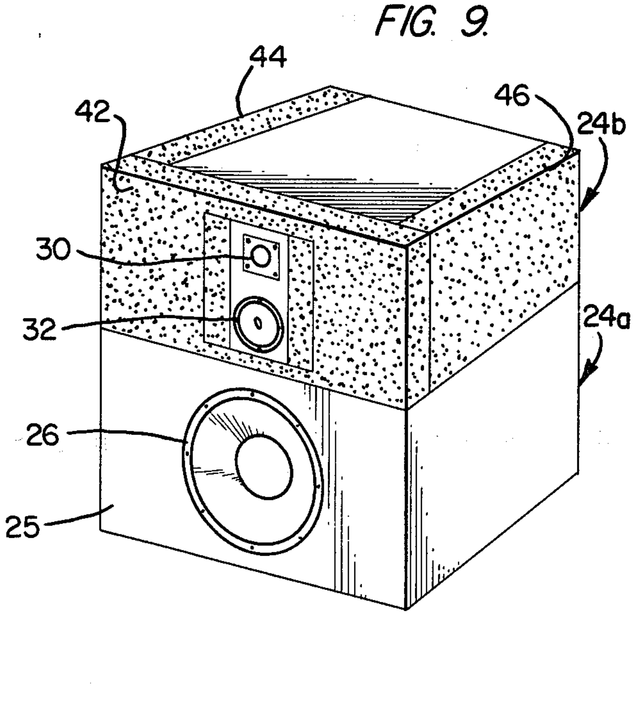
FIG. 9 is a perspective view depicting the basic speaker system of FIGS. 7 and 8 with the addition of a sound absorbing material.

As noted from FIGS. 9 and 12, the thicknesses of the sheets 42, 44 and 46 of sound absorbing material correspond to the spacing between the front panel 28 and the sides 34 and 36 of the subenclosure 24*b* relative to the front panel 25 and the sides 38 and 40 of the subenclosure 24*a*, respectively. In the region surrounding the midrange driver 30 and the tweeter driver 32, the sheet 42 is cut out and is flared outwardly from the drivers towards the outer surface of the sheet, as shown by the reference numeral 50.

The speaker system of FIGS. 7-12 enjoys several advantages including the prevention of the formation of objectionable standing waves due to the absorption of high energy between the drivers 30 and 32 and the corresponding front edges of the subenclosure 24*b*. Also, the angled portion 50 of the sheet 42 of sound absorbing material permits absorption at a more gradual rate than if a square edge were used. Further, the location of the drivers 26, 30 and 32 along a vertical line bisecting front panels 25 and 28 of the subenclosures 24*a* and 24*b*, respectively, insures a symmetrical polar response pattern while the relative close spacing between the midrange driver 30 and the tweeter driver 32 insures relatively high angular dispersion in the vertical plane and reduces undesirable lobes forming in the polar response pattern. Still further, the positioning of the midrange driver 30 and the tweeter driver 32 in a plane recessed from the plane of the woofer driver 26 compensates for the time delay difference between the drivers.

Figure 13:
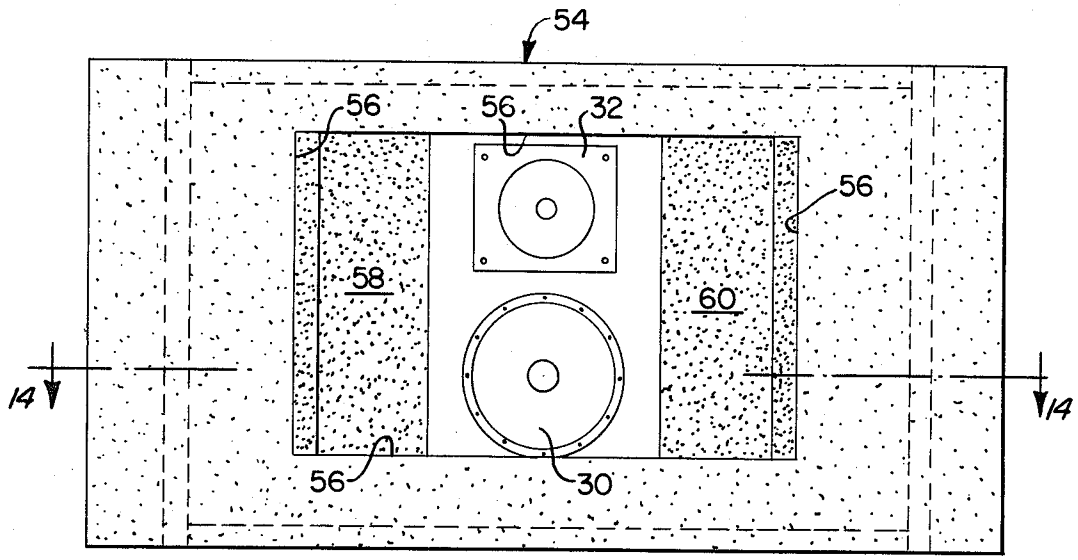
FIG. 13 is an enlarged partial front elevated view of the speaker system of FIGS. 9-12 and depicting an alternative feature of the latter system.
Figure 14:
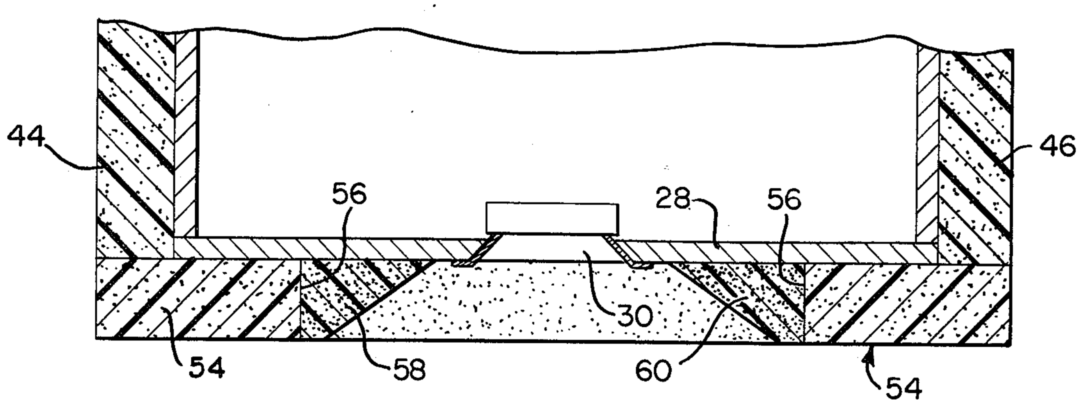
FIG. 14 is a cross-sectional view taken along the line 14—14 of FIG. 13.

FIGS. 13 and 14 depict an alternate design of a sheet of sound absorbing material that can be used in the speaker system of FIGS. 9-12. In particular, a sheet 54 of sound absorbing material is provided which extends over the panel 28 of the subenclosure 24*b*. The sheet 54 has a rectangular opening 56 formed therethrough which extends around the midrange driver 30 and the tweeter driver 32. A pair of separate, individual strips 58 and 60 of sound absorbing material extend to the sides of drivers 30 and 32 and within the opening 56 defined by the sheet 54. Each strip 58 and 60 is flared outwardly from the drivers 30 and 32 towards the outer surface of the sheet 54, as shown in FIG. 14. According to a preferred design, the strips 58 and 60 are constructed of a material that has a slightly lesser sound absorbing capability when compared to that of the sheet 54. This arrangement provides a smoother transition in the amount of absorption as a function of frequency and provides an additional improvement in overall performance compared to the use of a single type of absorbing material with uniform characteristics over its entire surface.

It is also emphasized that the angled portions of the strips 58 and 60 may be employed as a means of controlling or limiting the angular dispersion of the midrange driver 30 and the tweeter driver 32, if desired.

In each of the above-described embodiments, the aforementioned sheets of sound absorbing material may be formed of a plastic foam such as of the type 1334 polyurethane having a density of 1.3 pounds per cubic foot, a compression set equal to 34 pounds, and a thickness of approximately two inches.

Alternatively, a material, such as a polyester foam type 1530 having a greater sound absorbing capability than that of the type 1334 polyurethane, may be used with the exception that with respect to the strips 58 and 60 in the embodiment of FIGS. 13 and 14, it is preferred to utilize the type 1334 polyurethane foam.

As a result of the foregoing, the speaker system of each of the foregoing embodiments exhibits a markedly flatter curve of amplitude response vs. frequency than normally obtainable, a radiation pattern, i.e., angular dispersion, which is symmetrical about the forward geometrical axis of the enclosure, and a pulse response which is essentially free of ringing due to the delayed reradiation from the diffraction images.

It is understood that variations may be made in the foregoing without departing from the scope of the invention. For example, in the embodiment of FIGS. 9–12, a sheet of sound absorbing material may be placed on the top side portion of the subenclosure **24*b* as viewed in FIG. 9, and/or on the front panel and/or the sides of the subenclosure 24*a***.

Of course, other variations of the specific construction and arrangement of the speaker system disclosed above can be made by those skilled in the art without departing from the invention as defined in the appended claims.

I claim:

1. A speaker system comprising an enclosure formed in part by at least one substantially flat panel having a plurality of edges, a plurality of drivers mounted to said panel for radiating sound waves within predetermined frequency ranges outwardly from said panel in a pattern such that a portion of each sound wave tends to propagate along the outside surface of said panel towards said edges where it is diffracted; the dimensions of said panel relative to the wavelengths of the sound waves from at least one of said drivers being such that said diffracted sound wave portions from said at least one driver would normally cause audible waveform distortions and frequency aberrations; and a sound absorbing material disposed on the outer surface of said panel between said at least one driver and said edges and exposed to said sound wave portions from said at least one driver, said material having a thickness and sound absorption efficiency within the respective frequency range of said at least one driver to absorb the majority of said latter sound wave portions to the extent that the audible effects of said distortions and aberrations are eliminated.

2. The system of claim 1, wherein said enclosure is further formed by a plurality of additional flat panels.

3. The system of claim 2, wherein said additional panels extend perpendicular to the first-mentioned panel and are connected to said first-mentioned panel along said edges.

4. The system of claim 3, further comprising additional sound absorbing material disposed on the outer surfaces of said additional panels.

5. The system of claim 4, wherein the sound absorbing material on said first-mentioned panel overlaps the sound absorbing material on said additional panels.

6. The system of claim 2, further comprising an additional driver mounted on one of said additional panels and adapted to radiate sound waves within a low frequency range relative to said at least one driver, said one additional panel being free of said sound absorbing material.

7. The system of claim 2, wherein the first-mentioned panel and one of said additional panels extend in the front of said enclosure and the remaining additional panels extend perpendicular to said first-mentioned panel and said one additional panel.

8. The system of claim 7, further comprising an additional driver mounted on said one additional panel and adapted to radiate sound waves within a low frequency range relative to said at least one driver, said one additional panel being free of said sound absorbing material.

9. The system of claim 1, wherein a portion of said sound absorbing material surrounds said at least one driver.

10. The system of claim 9, wherein the portions of said material surrounding said at least one driver are flared outwardly from said driver to permit a gradual absorption of said sound wave portions from said driver.

11. The system of claim 10, wherein the flared portion of said material has different sound absorbing properties than the remaining portion of said material.

12. The system of claim 2, wherein the first-mentioned panel and said additional panels are arranged to form a first subenclosure and a second subenclosure extending over said first subenclosure, said at least one driver and said sound absorbing material being associated with said first subenclosure and further comprising at least one additional driver associated with said additional subenclosure, said additional subenclosure being free of said sound absorbing material.

* * * * *